United States Patent
Bae et al.

(10) Patent No.: US 7,834,692 B2
(45) Date of Patent: Nov. 16, 2010

(54) PEAK DETECTOR WITH ACTIVE RIPPLE SUPPRESSION

(75) Inventors: Hyeon Min Bae, Champaign, IL (US); Naresh Shanbhag, Champaign, IL (US); Jonathan B. Ashbrook, Homer, IL (US)

(73) Assignee: Finisar Corporation, Sunnyvale, CA (US)

( * ) Notice: Subject to any disclaimer, the term of this patent is extended or adjusted under 35 U.S.C. 154(b) by 361 days.

(21) Appl. No.: 11/856,691

(22) Filed: Sep. 17, 2007

(65) Prior Publication Data

US 2009/0072865 A1    Mar. 19, 2009

(51) Int. Cl.
    H03F 3/45    (2006.01)
    G01R 19/04   (2006.01)
(52) U.S. Cl. .......................................... 330/254; 327/61
(58) Field of Classification Search ................... 398/202; 330/254, 278, 279; 455/219, 232.1, 234.1, 455/246.1, 245.1; 375/345; 327/50, 58, 327/61, 62, 63, 65, 68, 69, 70, 71, 83, 85, 327/89
See application file for complete search history.

(56) References Cited

U.S. PATENT DOCUMENTS

| | | | |
|---|---|---|---|
| 6,661,287 B2 * | 12/2003 | Lin et al. | 330/254 |
| 2005/0152705 A1 * | 7/2005 | Inoue et al. | 398/202 |
| 2006/0132235 A1 * | 6/2006 | Ozawa | 330/254 |

\* cited by examiner

*Primary Examiner*—Robert Pascal
*Assistant Examiner*—Ryan Johnson
(74) *Attorney, Agent, or Firm*—Workman Nydegger

(57) ABSTRACT

A peak detector circuit that responds rapidly to power transients, and yet is able to avoid interpreting data fluctuations as power transients by generating dual peak signals from an amplifier's differential output signal, where the dual peak signals have data ripple components that tend to cancel one another. The system and methods permit the peak detectors to be much more responsive to power transients by expanding their bandwidth (shortening the time constants) to the point that low frequency data components affect the individual peak detector signals, but the effects are cancelled out when the individual components are added together. The peak detector described herein may be used in an AGC system to provide ripple-free gain control signals, while rapidly following any power transients in transmitted signals.

19 Claims, 3 Drawing Sheets

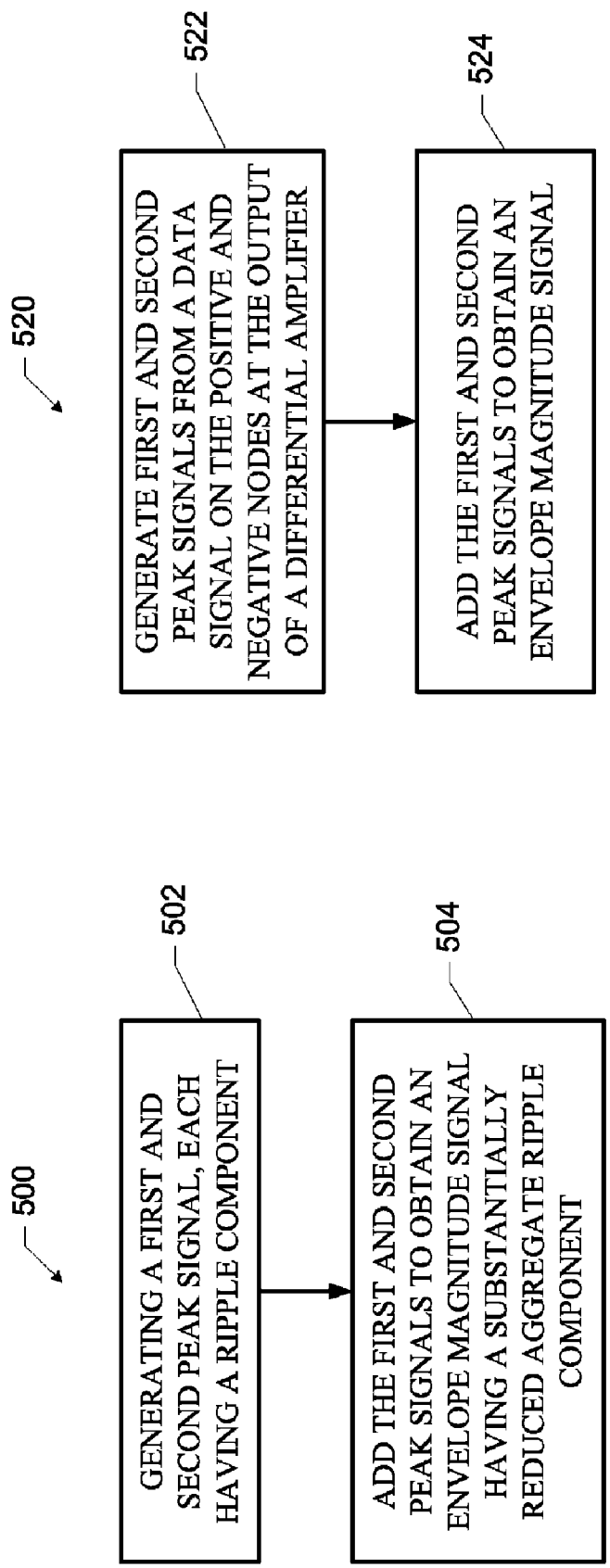

PEAK DETECTOR WITH ACTIVE RIPPLE SUPPRESSION

BACKGROUND OF THE INVENTION

A. Field of the Invention

The invention described herein relates to methods and devices for providing a signal peak detector having rapid response to signal envelope variations while reducing ripple due to low frequency data components.

B. Description of the Related Art

In communication systems, variations of the amplitude of the received signals require continuing adjustments of the receiver's gain in order to maintain a relatively constant output signal. For example, power transients caused by switching devices may create power fluctuations as channels are added or dropped. A variable gain amplifier (VGA) with automatic gain control (AGC) is commonly used to automatically maintain a constant signal level at the output of the analog front end of the receiver. AGC systems typically measure the peak value of the waveform of the VGA output to detect any power fluctuations.

Peak detectors are typically used to measure the peak value of the fluctuating electrical signals. It is desirable to have a peak detector that is capable of tracking amplitude variations due to undesired power fluctuations rather than to interpret amplitude variations that are due to data signal components. Typically the bandwidth of a peak detector is sufficiently low so that frequency components associated with the data signaling is not passed through the peak detector.

SUMMARY OF THE INVENTION

Described herein is a peak detector circuit that responds rapidly to power transients, and yet is able to avoid interpreting data fluctuations as power transients by generating dual peak signals from an amplifier's differential output signal, where the dual peak signals have data ripple components that tend to cancel one another. The system and methods permit the peak detectors to be much more responsive to power transients by expanding their bandwidth (shortening the time constants) to the point that low frequency data components affect the individual peak detector signals, but the effects are cancelled out when the individual components are added together. The peak detector described herein may be used in an AGC system to provide ripple-free gain control signals, while rapidly following any power transients in transmitted signals. Preferred embodiments may be used in optical communication systems to enable the detection of power fluctuations due to the operation of optical add/drop multiplexers, while simultaneously rejecting apparent signal level drop due to a series of consecutive identical digits (CID). In SONET optical systems, the sequence may extend to 72 CID.

In one embodiment, the signal envelope detection circuit comprises a pair of peak detectors operating on a differential voltage signal, wherein the peak detectors have bandwidths sufficiently high such that each of the pair of peak detectors has an output which exhibits a voltage ripple associated with low frequency components of a data signal present in the differential voltage signal; and, an active ripple cancellation circuit for adding the outputs of the pair of peak detectors to generate an envelope magnitude signal and to cancel the voltage ripple. In addition, the peak detector bandwidths are sufficiently low such that the voltage ripples associated with the low frequency components are substantially symmetrical to each other. This symmetry is obtained by the presence of a capacitor within each peak detector that is charged and discharged at equivalent rates by the low frequency data components. That is, in the presence of the low frequency components (and the absence of power transients), the capacitors are cyclically charged to a voltage by current flowing through a diode and then discharged by an amount, preferably in a range of between 5 and 25 percent of the voltage, such that the current in subsequent charging cycles remain in a linear region of the diode. Faster discharge rates (again, in the absence of a power transient) would result in a nonlinear charging period due to the diode I-V characteristic. This would result in ripple signals that would not be symmetric, and would therefore not substantially cancel each other.

Preferably, the envelope magnitude signal is indicative of an error between a desired envelope reference and the peak detector output. A charge pump may be connected to the active ripple canceller for maintaining a cumulative desired gain control signal. A reference voltage representing a desired peak target voltage may be applied to a third peak detector for generating a processed reference voltage. The active ripple cancellation circuit preferably includes adders to compare the outputs of the pair of peak detectors to the processed reference voltage to generate the envelope magnitude signal. The peak detector capacitors are preferably discharged via a base current of an emitter degeneration transistor.

BRIEF DESCRIPTION OF THE DRAWINGS

The objects, features and advantages of the present invention will be more readily appreciated upon reference to the following disclosure when considered in conjunction with the accompanying drawings, in which:

FIGS. 5A and 5B depict flow diagrams of preferred methods.

DETAILED DESCRIPTION OF THE PREFERRED EMBODIMENT

Figure 1:
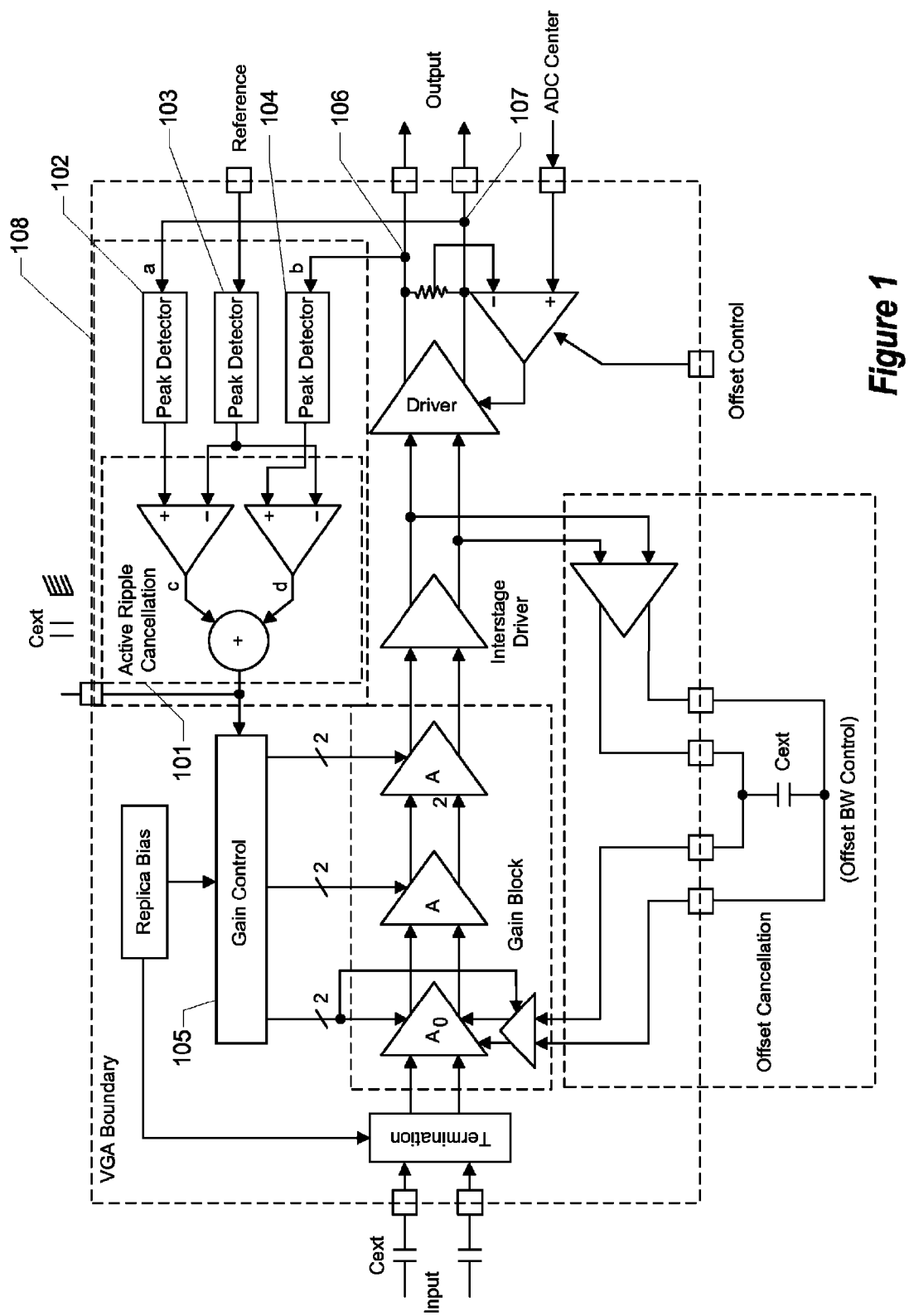
FIG. 1 depicts a block diagram of a system using the fast peak detector and active ripple canceller in an AGC application.

With reference to FIG. 1, one embodiment of an AGC system 108 with fast peak detection and active ripple cancellation is described. The AGC 108 incorporates three fast peak detectors followed by an active ripple canceller (ARC) 101 to track dynamic power transients while being insensitive to the data-dependent ripple at the output of the peak detectors caused by a long string of CID. In order to achieve ripple cancellation, the peak detectors are tuned so that the ripple components of the signal when run through the ARC offset each other.

The AGC 108 receives input from the differential output of the VGA at nodes 106 and 107. In the example of transmitted signals being 72 CID, the input signals to peak detectors 102 and 104 are single-sided high-frequency signals with opposite polarities. Although the peak detector includes a low pass-filtering characteristic, the time constant is fast enough that data variations associated with low frequency components of the data signal will appear at the output of the peak detectors. This allows maximum tracking of power transients. The output of each peak detector can be modeled as a peak (DC) waveform $V_p$ representing the signal envelope plus a ripple component $R[V_{o+}]$ or $R[V_{o-}]$ due to the data-dependent signal. In order to achieve optimal AGC performance, the ripple component of the peak detector output is eliminated by the ARC 101 before the signal is fed back to the gain block 105. To control the desired signal level, a reference voltage is also provided to the AGC 108, and the signal envelope amplitude deviation will be measured with respect to this reference. Note that the reference voltage is also passed through a fast peak detector 103 to generate a processed reference voltage that may be used to ensure the reference is subjected to the same diode drop associated with the diode connected transistor to achieve process, temperature insensitivity.

Figure 2:
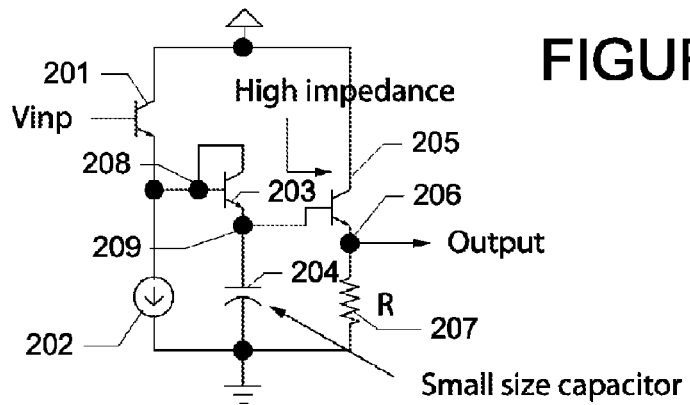
FIG. 2 depicts a peak detector tuned to a high bandwidth.

FIG. 2 is a diagram of the specially tuned peak detector circuit. The peak detector circuit includes transistors 201, 203, and 205, a capacitor 204, a resistor 207, and a current source 202. The input signal $V_{inp}$ is fed into the base of the transistor 201 and the output of the peak detector circuit is taken from the emitter of the transistor 205 at node 206. The output from the emitter of the transistor 201 is input to the base of the transistor 203 and to the current source 202. The collector of the transistor 203 is fed to its base so that it operates as a diode connecting nodes 208 and 209. The output from the emitter of the transistor 203 is input to the base of the transistor 205 and to the capacitor 204. The emitter of the transistor 205 is connected to the resistor 207. The output of the current source 202, the capacitor 204, and the resistor 207 share a common grounding point. The collector of the transistor 201 is connected to the collector of the transistor 205.

Figure 3:
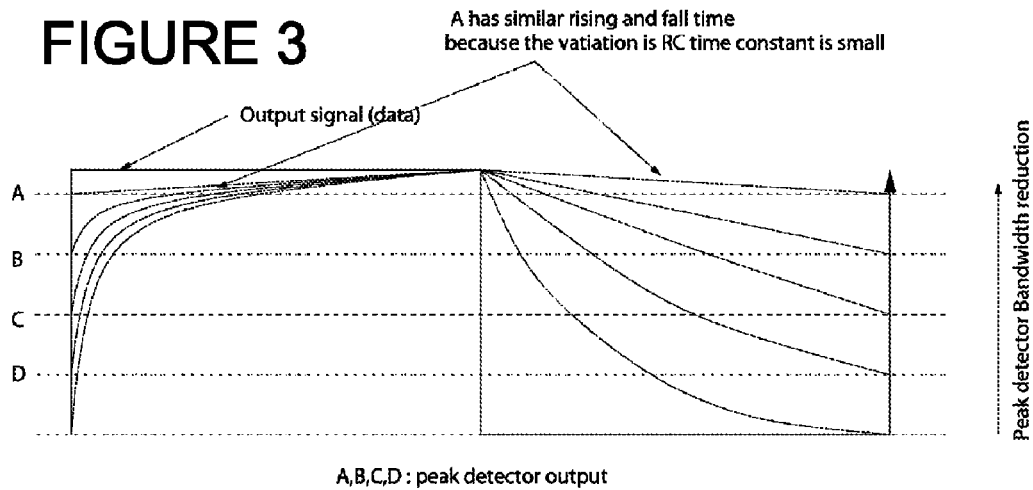
FIG. 3 depicts a diagram showing peak detector response curves.

In order to achieve ripple cancellation, the time constants of the peak detectors are tuned so that the rise and decay characteristics of the ripple components are similar. This is because one peak detector will be charging, while the other one is decaying. FIG. 3 shows four examples A, B, C, and D of rise and decay characteristics of the ripple components of the output from the peak detector circuit. As the peak detector bandwidth decreases, the rise and decay characteristics of the ripple component become more similar. As FIG. 3 shows, A is the desired ripple component because of the small variation in rise and decay characteristics that will offset each other when added together. Yet note that the peak detector bandwidth is still much greater than a typical prior art peak detector because the bandwidth is wide enough that the fast peak detector, if used by itself, would generate a peak signal having significant data-dependent ripple that would disrupt the operation of a VGA. However, by tuning the peak detectors and configuring them to operate on both sides of the differential signal, the data ripple components are significantly symmetric such that they are effectively cancelled.

In order to obtain this characteristic in the ripple components, the transistor 203 in FIG. 2 preferably operates in high-resistance region so that the rise and decay of the ripple component can be approximated as a first order response. To this end, the capacitance of the capacitor 204, the effective diode resistance of the transistor 203 and the resistance of the resistor 203 are chosen so that node 206 exhibits similar charge-up and discharge transients in the presence of 72 CID, which is associated with the SONET optical communication specification. Yet the capacitance of the capacitor 204 depicted in FIG. 2 is kept small enough to enhance tracking performance.

Figure 4:
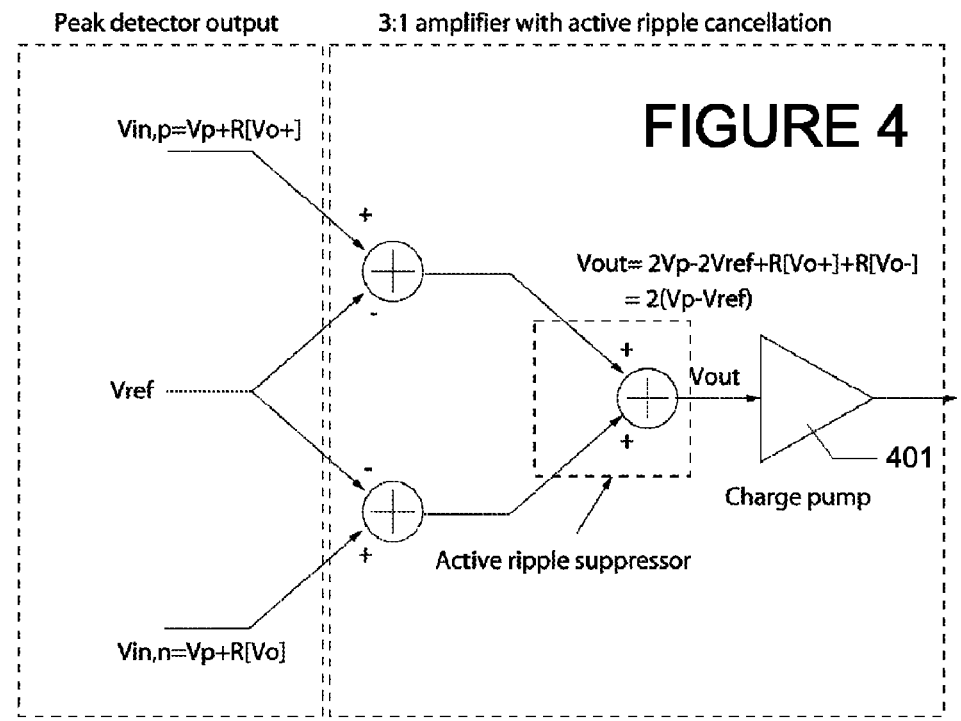
FIG. 4 depicts a block diagram of the active ripple canceller circuit.

FIG. 4 depicts the block diagram of a preferred embodiment of the active ripple canceller (ARC) 101 in FIG. 1. The ARC receives inputs from peak detectors 102, 103, and 104 and outputs to the gain control 105 through a charge pump 401. In the case of CID signals, the inputs to the ARC are $V_{in,p}=V_p+R[V_{o+}]$, $V_{in,n}=V_p+R[V_{o-}]$, and $V_{ref}$, where $V_p$ is the envelope wave form caused by the power transient, $R[V_{o+}]$ and $R[V_{o-}]$ are the pseudo-differential ripple components with opposite polarities caused by the data-dependent signals, and $V_{ref}$ is the output of peak detector 103, representing the desired signal level. The signal $V_{out}$ is formed by first subtracting $V_{ref}$ from $V_{in,p}$ and $V_{in,n}$ respectively, and then adding the resulting signals together: $V_{out}=2 V_p-2 V_{ref}+R[V_{o+}]+R[V_{o-}]=2(V_p-V_{ref})$. $V_{out}$ is then run through the charge pump and output to the gain control 105 depicted in FIG. 1.

As FIG. 4 shows, the ripple components $R[V_{o+}]$ and $R[V_{o-}]$ of the peak detector outputs offset each other due to opposite polarities and the resulting control signal is proportional to the variation in the peak wave form $V_p$ with respect to the reference signal $V_{ref}$.

In FIG. 5, a preferred method 500 of detecting a signal envelope is set forth. The method includes step 502 of generating a first and second peak signal, each having a ripple component. The first peak signal is generated from a data signal on a positive node of a differential amplifier and a second peak signal from a data signal on a negative node of a differential amplifier. The ripple components are associated with low frequency components of a data signal being amplified by the differential amplifier. At step 504 the first and second peak signals are added to obtain an envelope magnitude signal having a substantially reduced aggregate ripple component.

An alternative method 520 of detecting a signal envelope is shown in FIG. 5B. At step 522 first and second peak signals are generated from a data signal on the positive and negative nodes at the output of a differential amplifier. At step 524, the first and second peak signals are added to obtain an envelope magnitude signal. Preferably, the first and second peak signals are compared to a reference voltage prior to being added. The first and second peak signals are preferably generated by peak detectors having time constants sufficiently fast such that the first and second peak signals will decay in a range of between 5 percent and 25 percent in the presence of a 72 consecutive identical digit data signal. The first and second peak signals also contain ripple voltages associated with low frequency components of a data signal. The ripple components are substantially symmetrical and cancel each other out when the first and second peak signals are added to obtain the envelope magnitude signal. The envelope magnitude signal is preferably applied to a charge pump circuit to generate a gain control voltage, which may then be used to adjust the gain of the differential amplifier.

The claims should not be read as limited to the described order of elements unless stated to that effect. In addition, use of the term "means" in any claim is intended to invoke 35 U.S.C. §112, paragraph 6, and any claim without the word "means" is not so intended. Therefore, all embodiments that come within the scope and spirit of the following claims and equivalents thereto are claimed as the invention.

We claim:

1. A signal envelope detection circuit comprising:
   a pair of peak detectors operating on a differential voltage signal, wherein the peak detectors have bandwidths sufficiently high such that each of the pair of peak detectors has an output that exhibits a voltage ripple associated with low frequency components of a data signal present in the differential voltage signal; and
   an active ripple cancellation circuit configured to combine the outputs of the pair of peak detectors to generate an envelope magnitude signal in which the voltage ripples exhibited in the peak detector outputs offset each other so as to substantially cancel each other out.

2. The signal envelope detection circuit of claim 1 wherein each of the pair of peak detectors includes a capacitor that is charged and discharged at equivalent rates by the low frequency components.

3. The signal envelope detection circuit of claim 1 wherein each of the pair of peak detectors includes a capacitor that in the presence of the low frequency components is cyclically charged to a voltage by current flowing through a diode and discharged by an amount, where the amount of discharge is in a range of between 5 and 25 percent of the voltage, such that the current in subsequent charging cycles remain in a linear region of the diode.

4. The signal envelope detection circuit of claim 1 wherein the envelope magnitude signal is indicative of an error between a desired envelope reference and the peak detector output, and further comprising a charge pump connected to the active ripple canceller for maintaining a cumulative desired gain control signal.

5. The signal envelope detection circuit of claim 1 further comprising a third peak detector for generating a processed reference voltage, wherein the active ripple cancellation circuit includes elements that compare the outputs of the pair of peak detectors to the processed reference voltage to generate the envelope magnitude signal.

6. The signal envelope detection circuit of claim 1 wherein each of the pair of peak detectors includes a capacitor that is discharged via a base current of an emitter degeneration transistor.

7. The peak detector circuit of claim 1 wherein the low frequency components are associated with a 72 consecutive identical digit signal.

8. The peak detector circuit of claim 1 wherein the peak detector bandwidths are sufficiently low such that the voltage ripples associated with the low frequency components are substantially symmetrical to each other.

9. A method of detecting a signal envelope comprising:
generating a first peak signal from a data signal that is output at a positive node of a differential amplifier and a second peak signal from a data signal that is output at a negative node of the differential amplifier, wherein each of the first and second peak signals has a ripple component associated with low frequency components of a data signal being amplified by the differential amplifier; and
combining the first and second peak signals to obtain an envelope magnitude signal having a substantially reduced aggregate ripple component.

10. The method of claim 9 wherein the first and second peak signals are generated by peak detectors.

11. The method of claim 9 wherein the ripple components are associated with charging and discharging capacitors.

12. The method of claim 11 wherein the charge time and discharge time of the capacitors for frequencies near the low frequency component are equivalent.

13. A method of detecting a signal envelope comprising:
generating a first peak signal from a data signal that is output at a positive node of a differential amplifier and a second peak signal from a data signal that is output at a negative node of the differential amplifier; and
combining the first and second peak signals to obtain an envelope magnitude signal,
wherein generating the first and second peak signals includes charging and discharging first and second capacitors at a predetermined rate, the predetermined rate being tuned such that a first ripple component produced in the first peak signal is substantially symmetrical to a second ripple component produced in the second peak signal.

14. The method of claim 13 wherein the first and second peak signals are compared to a reference voltage prior to being combined.

15. The method of claim 13 wherein the first and second peak signals are generated by peak detectors having time constants sufficiently fast such that the first and second peak signals will decay in a range of between 5 percent and 25 percent in the presence of a 72 consecutive identical digit data signal.

16. The method of claim 13 wherein the ripple components are associated with low frequency components of a data signal.

17. The method of claim 16 wherein the ripple components cancel each other out when the first and second peak signals are combined to obtain the envelope magnitude signal.

18. The method of claim 13 wherein the envelope magnitude signal is applied to a charge pump circuit to generate a gain control voltage.

19. The method of claim 18 wherein the gain control voltage is used to adjust the gain of the differential amplifier.

* * * * *